(12) United States Patent
Hosokawa

(10) Patent No.: US 10,298,209 B2
(45) Date of Patent: May 21, 2019

(54) DIGITAL FILTER DEVICE AND SIGNAL PROCESSING METHOD

(71) Applicant: NEC Corporation, Minato-ku, Tokyo (JP)

(72) Inventor: Kohei Hosokawa, Tokyo (JP)

(73) Assignee: NEC CORPORATION, Tokyo (JP)

( * ) Notice: Subject to any disclaimer, the term of this patent is extended or adjusted under 35 U.S.C. 154(b) by 663 days.

(21) Appl. No.: 14/891,844

(22) PCT Filed: Jun. 2, 2014

(86) PCT No.: PCT/JP2014/002899
§ 371 (c)(1),
(2) Date: Nov. 17, 2015

(87) PCT Pub. No.: WO2014/196180
PCT Pub. Date: Dec. 11, 2014

(65) Prior Publication Data
US 2016/0105160 A1    Apr. 14, 2016

(30) Foreign Application Priority Data
Jun. 3, 2013  (JP) .................................. 2013-116760

(51) Int. Cl.
*H03H 17/02* (2006.01)
*H03H 17/04* (2006.01)

(52) U.S. Cl.
CPC ........ *H03H 17/0261* (2013.01); *H03H 17/04* (2013.01)

(58) Field of Classification Search
CPC .......................................... H03H 17/00–17/08
See application file for complete search history.

(56) References Cited

U.S. PATENT DOCUMENTS 9,831,956 B2 * 11/2017 Yasuda ................ H04B 10/613
2010/0250638 A1 * 9/2010 Asami ................ H03H 17/0294
708/304

(Continued)

FOREIGN PATENT DOCUMENTS

JP    05-227514 A    9/1993
JP    09-74334 A     3/1997

(Continued)

OTHER PUBLICATIONS

Liang B. Du and Arthur J. A. Lowery, "Improved single channel backpropagation for intra-channel fiber nonlinearity compensation in long-haul optical communication systems", Optics Express, vol. 18, No. 16, pp. 17075-17088, Aug. 2, 2010.

(Continued)

*Primary Examiner* — Matthew D Sandifer

(57) ABSTRACT

Provided is a digital filter device including data rearrangement means for executing rearrangement of input data and outputting rearranged data, intermediate data calculation means for processing the rearranged data input at a specific time and generating intermediate data, filter output first calculation means for calculating a first output value at the specific time by use of the intermediate data, delay means for delaying the rearranged data by processing time taken in the intermediate data calculation means and the file output first calculation means, and filter output second calculation means for inputting output values from the delay means and the filter output first calculation means, calculating a second output value at a time other than the specific time, and outputting a filter output value obtained by adding up the first and second output values. Consequently, it becomes feasible to reduce a circuit scale without impairing performance of a digital filter used in nonlinear compensation and realize nonlinear compensation by an LSI.

10 Claims, 13 Drawing Sheets

(56) References Cited

U.S. PATENT DOCUMENTS

2012/0086504 A1* 4/2012 Tsukamoto ......... H04L 27/3863
327/551
2012/0176190 A1* 7/2012 Goodman ........... H03M 1/0626
327/551

FOREIGN PATENT DOCUMENTS

| JP | 11-55076 A | 2/1999 |
| JP | 2004-343162 A | 12/2004 |
| WO | 2009/072197 A1 | 6/2009 |

OTHER PUBLICATIONS

Weizhen Yan et al., "Low Complexity Digital Perturbation Back-propagation" ECOC Technical Digest 2011, paper Tu.3.A.2., Jul. 27, 2011.
International Search Report for PCT Application No. PCT/JP2014/002899, dated Aug. 12, 2014.
English Translation of Written Opinion for PCT Application No. PCT/JP2014/002899.

* cited by examiner

Fig. 3

| | 1 | 2 | 3 | ... | 32 | 33 | 34 | 35 | ... | 64 | |
|---|---|---|---|---|---|---|---|---|---|---|---|
| | 0 | 1 | 2 | ... | 31 | 4096 | 4097 | 4098 | ... | 4127 | }
| | 32 | 33 | 34 | ... | 63 | 4128 | 4129 | 4130 | ... | 4159 | 
| | 64 | 65 | 66 | ... | 95 | 4160 | 4161 | 4162 | ... | 4191 |
| | ... | ... | ... | ... | ... | ... | ... | ... | ... | ... |
| | 4032 | 4033 | 4034 | ... | 4063 | 8128 | 8129 | 8130 | ... | 8159 |
| | 4064 | 4065 | 4066 | ... | 4095 | 8160 | 8161 | 8162 | ... | 8191 |

FIRST FRAME / SECOND FRAME

31

TIME ↓

Fig. 9

| TIME | 64 | ... | 35 | 34 | 33 | 32 | ... | 3 | 2 | 1 | |
|---|---|---|---|---|---|---|---|---|---|---|---|
| | 4096 | ... | 4125 | 4126 | 4127 | 0 | ... | 29 | 30 | 31 | ⎫ |
| | 4128 | ... | 4157 | 4158 | 4159 | 32 | ... | 61 | 62 | 63 | ⎬ 91 |
| | 4160 | ... | 4189 | 4190 | 4191 | 64 | ... | 93 | 94 | 95 | |
| | ... | ... | ... | ... | ... | ... | ... | ... | ... | ... | FIRST FRAME |
| | ... | ... | ... | ... | ... | ... | ... | ... | ... | ... | |
| | 8128 | ... | 8157 | 8158 | 8159 | 4032 | ... | 4061 | 4062 | 4063 | |
| | 8160 | ... | 8189 | 8190 | 8191 | 4064 | ... | 4093 | 4094 | 4095 | SECOND FRAME |

DIGITAL FILTER DEVICE AND SIGNAL PROCESSING METHOD

This application is a National Stage Entry of PCT/JP2014/002899 filed on Jun. 2, 2014, which claims priority from Japanese Patent Application 2013-116760 filed on Jun. 3, 2013, the contents of all of which are incorporated herein by reference, in their entirety.

TECHNICAL FIELD

The present invention relates to a digital filter device and a signal processing method of a digital filter, and more particularly relates to a digital filter used in an optical digital coherent transceiver.

BACKGROUND ART

In recent years, a digital coherent optical communication technology capable of compensating for various types of distortion generated on a communication channel by a digital signal processing technology has been attracting attention in the optical communication field. Nonlinear distortion, a type of distortion generated on a communication channel, is caused by polarization not being proportional to an electric field of a light wave, mainly when intensity of a light wave is high. Nonlinear distortion includes self-phase modulation in which phase change is caused by intensity of the own light wave, cross-phase modulation in which phase change is caused by another light wave in wavelength division multiplexing or the like, four light wave mixing in which two or more light waves interact and generate a new light wave, and the like.

While a bit rate used in the optical communication currently under research and development exceeds 100 Gbps, a digital signal processor is able to operate only at a few GHz (Gbps: Gigabits per second, GHz: Gigahertz). In other words, the optical communication is approximately 100 times faster than digital signal processing. In order to fill the rate gap between the optical communication and the digital signal processing, the same number of digital signal processing circuits as the number of input signals arranged in parallel need to be arranged.

For example, even a process that can be performed by a single complex multiplier requires arrangement of 100 complex multipliers in order to fill the rate gap between the optical communication and the digital signal processing, and the circuit scale is several Mega gates. In an LSI that performs high-speed signal processing, a circuit scale of a single complex multiplier is several Mega gates and easily exceeds a design limit of an LSI (LSI: Large Scale Integration). Therefore, reduction in a circuit scale of an LSI performing high-speed signal processing is an important issue.

FIG. 11 illustrates an example of a general FIR filter 110 (FIR: Finite Impulse Response).

The FIR filter 110 in FIG. 11 includes a delay group 111, a multiplier group 113, and an adder group 115. The delay group 111 includes a plurality of delay (111-1, 111-2, 111-3, . . . , 111-N−1) (N: natural number equal to or greater than 2). The multiplier group 113 includes a plurality of multipliers (113-1, 113-2, . . . , 113-N−1, 113-N). The adder group 115 includes a plurality of adders (115-1, 115-2, . . . , 115-N−2, 115-N−1).

Since the FIR filter 110 illustrated in FIG. 11 requires one multiplier for implementing one tap, a digital filter needed in nonlinear compensation requires several hundred multipliers. Therefore, a circuit scale of a digital filter in a high-speed LSI such as an optical digital coherent transceiver is several hundred Mega gates.

FIG. 12 illustrates an example of a general IIR filter 120 (IIR: Infinite Impulse Response).

The IIR filter 120 in FIG. 12 includes a delay group 121, a first multiplier group 123, a second multiplier group 124, a first adder group 125, and a second adder group 126. The delay group 121 includes a plurality of delay (121-1, 121-2, . . . , 121-N). The first multiplier group 123 includes a plurality of multipliers (123-1, . . . , 123-N−1, 123-N). The second multiplier group 124 includes a plurality of multipliers (124-1, 124-2, . . . , 124-N, 124-N+1). The first adder group 125 includes a plurality of adders (125-1, 125-2, . . . , 125-N). The second adder group 126 includes a plurality of adders (126-1, 126-2, . . . , 126-N).

The IIR filter 120 illustrated in FIG. 12 can realize a filter having a better amplitude characteristic with a fewer number of multipliers than an FIR filter.

FIG. 13 is a configuration example of an IIR filter in which only a[1] has a nonzero value and zero otherwise, implemented on a system in which two signals are input in parallel. The IIR filter 130 in FIG. 13 includes adders 131 and 133, multipliers 132 and 134, and a delay device 135.

Further, as one of effective methods compensating for nonlinear distortion, there is a method called a back propagation method in which distortion generated on a communication channel is compensated in reverse order. The back propagation method includes a method compensating for only self-phase modulation as described in NPL 1 and a method compensating for not only self-phase modulation but also cross-phase modulation with another polarized wave as described in NPL 2.

CITATION LIST

Non Patent Literature

[NPL 1] L. Du and A. Lowery, in Optics Express, Vol. 18, No. 16, August pp. 17075-17088 (2010)
[NPL 2] W. Yan, et al., OFC2011, paper Tu.3.A.2.

SUMMARY OF INVENTION

Technical Problem

Increase in circuit scale as with the FIR filter 110 illustrated in FIG. 11 causes a problem in a unit cost, power consumption, a yield, and the like of an LSI, and therefore it is difficult to realize an LSI with a general FIR filter.

Further, the IIR filter 120 illustrated in FIG. 12 has a feedback type configuration, and therefore is difficult to realize a filter with parallel signals being input. Although a filter with parallel input signals can be configured with an IIR filter as illustrated in FIG. 13, a critical path 136 (dotted line), a path with the longest delay in an LSI, corresponds to two parallel signals, and therefore high-speed operation is not feasible. In other words, there is a problem that high-speed operation, required of an LSI processing the optical communication at over 100 Gbps because of the amount of signal processing, cannot be achieved by an IIR filter.

Further, a tap length of a digital filter depends on various parameters such as a length of a communication channel, intensity of a light wave, and a fiber type. While the back propagation method described in NPL 1, 2, and the like is effective in a long-haul optical communication system, a tap length therein is several hundred taps, also leading to a problem that a circuit scale of an LSI becomes large.

An objective of the present invention is to solve the aforementioned problem by reducing a circuit scale without impairing performance of a digital filter used in nonlinear compensation and providing a digital filter device capable of realizing nonlinear compensation by an LSI.

Solution to Problem

A digital filter device according to the present invention includes data rearrangement means for executing rearrangement of input data and outputting rearranged data, intermediate data calculation means for processing the rearranged data input at a specific time and generating intermediate data, filter output first calculation means for calculating a first output value at the specific time by use of the intermediate data, delay means for delaying the rearranged data by processing time taken in the intermediate data calculation means and the filter output first calculation means, and filter output second calculation means for inputting output values from the delay means and the filter output first calculation means, calculating a second output value at a time other than the specific time, and outputting a filter output value obtained by adding up the first and second output values.

A signal processing method according to the present invention includes executing rearrangement of input data and outputting rearranged data, processing the rearranged data input at a specific time and generating intermediate data, calculating a first output value at the specific time by use of the intermediate data, delaying the rearranged data by processing time for calculating the intermediate data and the first output value, inputting the delayed rearranged data and the first output value, calculating a second output value at a time other than the specific time, and outputting a filter output value obtained by adding up the first and second output values.

Advantageous Effects of Invention

The present invention reduces a circuit scale without impairing performance of a digital filter used in nonlinear compensation and provides a digital filter device capable of realizing nonlinear compensation by an LSI.

BRIEF DESCRIPTION OF DRAWINGS

FIG. 3 is an example of data output from the data rearrangement means according to the first exemplary embodiment of the present invention.

FIG. 9 is an example of data output from data rearrangement means according to the third exemplary embodiment of the present invention.

DESCRIPTION OF EMBODIMENTS

Exemplary embodiments of the present invention will be described below with reference to the drawings. Although technically preferred limitations for implementing the present invention are applied to the exemplary embodiments described below, the scope of the invention is not limited thereto.

First, a digital filter device according to an overview of an exemplary embodiment of the present invention will be described in detail with reference to FIG. 1.

Figure 1:
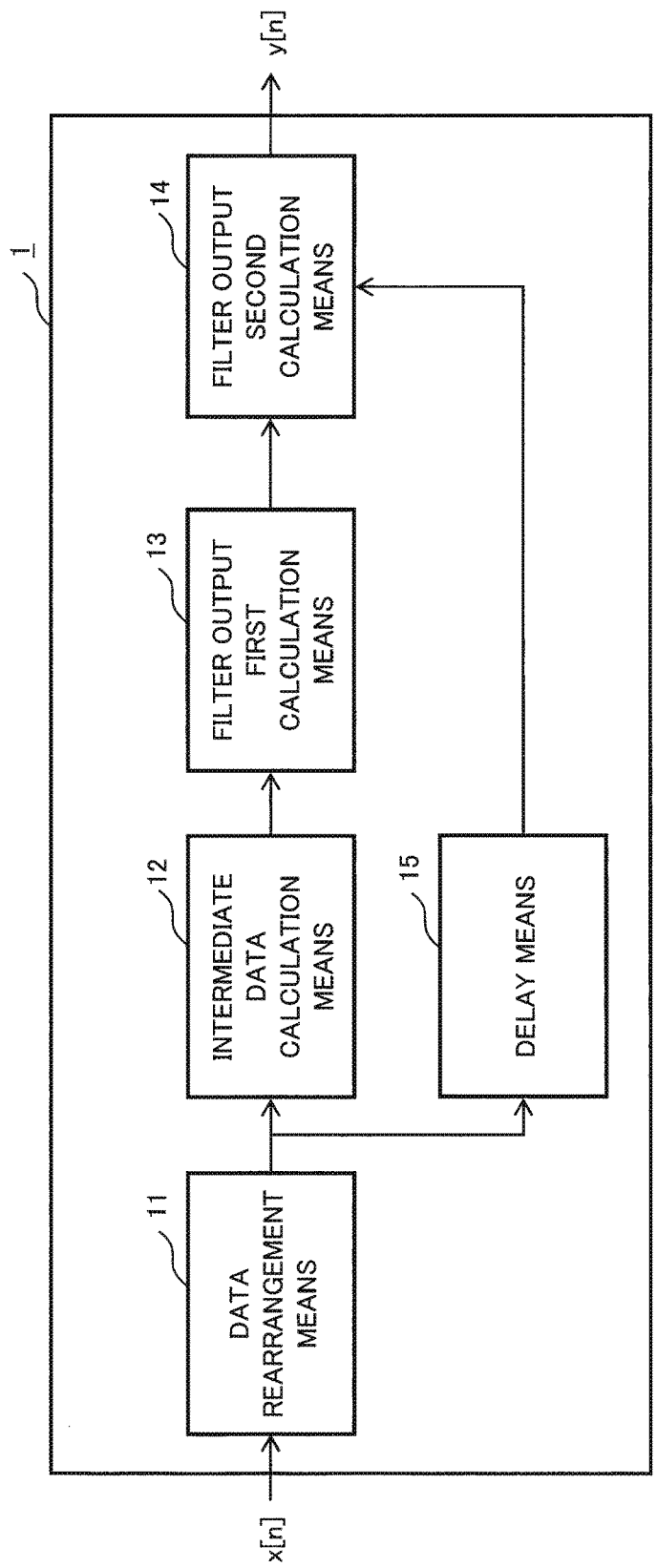
FIG. 1 is a block diagram illustrating a configuration of a digital filter device according to an overview of an exemplary embodiment of the present invention.

Referring to FIG. 1, a digital filter device 1 according to the overview of the exemplary embodiment of the present invention includes data rearrangement means 11, intermediate data calculation means 12, filter output first calculation means 13, filter output second calculation means 14, and delay means 15.

The data rearrangement means 11 performs rearrangement of input data. Rearranged input data are referred to as rearranged data. The data rearrangement means 11 outputs rearranged data to the intermediate data calculation means 12 and the delay means 15.

For example, when a data group in which one frame is composed of L columns×M rows is input as input data, the data rearrangement means 11 rearranges data sorted in the row direction to data sorted in the column direction and converts the data group into an L columns×M rows data group with a data array different from the input data. Further, the data rearrangement means 11 may rearrange the data so as to reverse head and tail of rearranged data when a data group in which one frame is composed of L columns×M rows is input.

Further, the data rearrangement means 11 may generate rearranged data with the number of rows changed on the basis of the number of rearrangement circuits included in the data rearrangement means 11. Use of rearranged data with the number of rows changed on the basis of the number of rearrangement circuits included in the data rearrangement means 11 provides efficient utilization of the rearrangement circuits.

A data rearrangement method in the data rearrangement means 11 is not limited to the examples described herein and data may be rearranged to a data array that facilitates calculation processing in a component in a subsequent stage. At a minimum, the data rearrangement means 11 has only to rearrange data to an array that facilitates calculation of intermediate data by the intermediate data calculation means 12.

It is assumed that an impulse response h[n] of a piece of data with a data number n is nonzero in a specific time range and 0 in the remaining time range (n: integer). When an impulse response h[n] is continuous, the length of the impulse response h[n] represents the aforementioned specific range. An impulse response h[n] may be nonzero in a discontinuous range. In other words, a time at which an impulse response h[n] is nonzero may be discrete.

A filter output y[n] can be expressed by a difference equation with x[n] as an input signal. Further, the difference equation can be expressed in a form of a recurrence formula by use of a filter output and an input signal around a specific time. A recurrence formula may be replaced by an approximate expression as appropriate so that a configuration of the delay means 15 may not become large.

The intermediate data calculation means 12 calculates intermediate data obtained by dividing data processed simultaneously at a specific time into data groups with a specific value. A specific time refers to a time included in a time range in which an impulse response is nonzero. Further, a division of intermediate data can be set to the number of rows of rearranged data input to the intermediate data calculation means 12.

For example, M pieces of data in a same column of a data group have only to be selected as data processed simultaneously at a specific time in the intermediate data calculation means 12. In that case, the intermediate data calculation means 12 processes data at intervals of M out of input data.

In other words, the intermediate data calculation means 12 calculates a partial value of the digital filter device 1. For example, the intermediate data calculation means 12 calculates intermediate data for calculating an output value of the digital filter device 1 only for data at a specific time included in a time range in which an impulse response is nonzero. The intermediate data calculation means 12 outputs the calculated intermediate data to the filter output first calculation means 13.

The filter output first calculation means 13 calculates an output value of the digital filter device 1 at a specific time (first output value) by use of the intermediate data calculated by the intermediate data calculation means 12.

For example, when a data group with L columns×M rows is input, the filter output first calculation means 13 calculates an output value of the digital filter device 1 for data at intervals of M input to the intermediate data calculation means 12 at a specific time.

The delay means 15 delays input data by time required for the intermediate data calculation means 12 to calculate intermediate data and for the filter output first calculation means 13 to calculate a first output value, and also provides input data required by the filter output second calculation means 14 at an appropriate timing. Time delayed by the delay means 15 is determined by a circuit length and processing performance of the intermediate data calculation means 12, a calculation order in the filter output second calculation means 14, and the like.

The filter output second calculation means 14 inputs rearranged data delayed by the delay means 15 and an output value of the digital filter device 1 calculated by the filter output first calculation means 13. The filter output second calculation means 14 calculates an output value of the digital filter device 1 for data at a time not processed by the filter output first calculation means 13 by use of a recurrence formula derived from a difference equation. For example, by defining an output value at a specific time and an output value at a time other than the specific time in a form of a recurrence formula, an output value at a time other than the specific time (second output value) can be calculated by use of the recurrence formula.

The filter output second calculation means 14 adds up the output value at the specific time (first output value) and the output value at a time other than the specific time (second output value), and outputs the total as a filter output.

As described above, the digital filter device according to the exemplary embodiment of the present invention first rearranges input data by the data rearrangement means and distributes the data to the intermediate data calculation means and the delay means. The intermediate data calculation means converts data input at a specific time into intermediate data, and the filter output first calculation means calculates a filter output by use of the intermediate data. Then, the filter output second calculation means calculates, by a recurrence formula, data input at a time other than the specific time and a filter output calculated by use of the intermediate data, and outputs a filter output. Thus, the digital filter device according to the present exemplary embodiment provides a filter output with a less amount of calculation processing than a general digital filter device, and then a circuit scale can be reduced.

In other words, an operation can be commonalized when calculating a filter output value being discrete at a specific time, and a filter output value at a time other than the specific time can be obtained from the discrete filter output value obtained in a previous cycle by use of a recurrence formula. Therefore, a circuit scale can be reduced without impairing performance of a digital filter used in nonlinear compensation and a digital filter capable of realizing nonlinear compensation by an LSI can be obtained.

Further, among distortion types generated on a communication channel, the digital filter device according to the exemplary embodiment of the present invention is able to compensate for nonlinear distortion not previously compensable by an LSI.

A signal processing method by the digital filter device according to the exemplary embodiment of the present invention and a program using the signal processing method are also included in the scope of the present invention.

A digital filter device according to the exemplary embodiment will be described in detail below by referring to exemplary embodiments with actual numerical values.

First Exemplary Embodiment

First, a digital filter device according to a first exemplary embodiment of the present invention will be described. The digital filter device according to the first exemplary embodiment is configured as a digital filter device 1 illustrated in FIG. 1. In the first exemplary embodiment, in an example of inputting a data group in which one frame is composed of L columns×M rows of data, description is made with assignment of actual numerical values such as the number of columns L being 32 and the number of rows M being 128.

Figure 2:
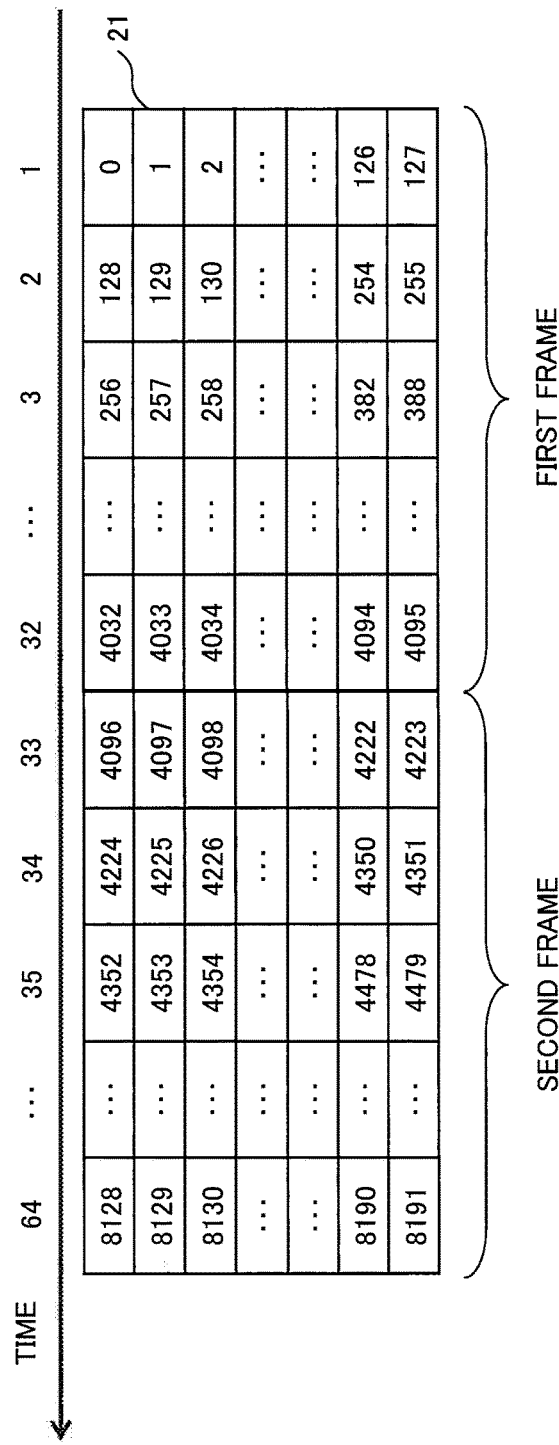
FIG. 2 is an example of data input to data rearrangement means according to a first exemplary embodiment of the present invention.

Data rearrangement means 11 rearranges input data 21 input in parallel as illustrated in FIG. 2 to rearranged data 31 in an array illustrated in FIG. 3.

Numbers indicated above the input data 21 represent time. At a given time, data in a same column of the input data 21 are input to the data rearrangement means 11.

Normally, data output from an ADC are input in a form of the input data 21 illustrated in FIG. 2 such that 128 pieces of data are input in parallel (ADC: Analog Digital Converter). Data input to the digital filter device according to the exemplary embodiment of the present invention may be input in such a way that the number of pieces of data input in parallel is other than 128, and there is no limitation in the range of numerical values.

In the input data 21 in FIG. 2, 0 denotes 0th data, 1 denotes 1st data, . . . , and 4095 denotes 4095th data.

For example, in the input data 21, data input at a time 1 are 0th, 1st, 2nd, . . . , 126th, and 127th data, and data input at a time 2 are 128th, 129th, 130th, . . . , 254th, and 255th data.

The data rearrangement means 11 handles, for example, 4096 (=32 columns×128 rows) pieces of data as one frame and rearranges the data so that the data are arrayed as the rearranged data 31 in FIG. 3 in synchronization with each clock cycle. In the present exemplary embodiment, the number of rows and the number of columns of a frame are not changed.

Note the top row of each data group illustrated in FIGS. 2 and 3. The data rearrangement means 11 rearranges an array of data at intervals of 128 such as 0, 128, 256, . . . as the input data 21 in FIG. 2 to an array of data in an original order such as 0, 1, 2, . . . as the rearranged data 31 in FIG. 3. On the other hand, an array of data at intervals of 32 such as 0, 32, 64, . . . are output in parallel at the time 1. In other words, the data rearrangement means 11 according to the present exemplary embodiment converts the input data 21 in which data are arrayed in the column direction into the rearranged data 31 in which data are rearranged in the row direction, and outputs the data.

In the back propagation method described in NPL 1, a linear compensator and a nonlinear compensator are processed alternately. A linear compensator is generally processed in a frequency domain, and therefore is configured as FFT, multiplication processing, and IFFT (FFT: Fast Fourier Transform, IFFT: Inverse Fast Fourier Transform).

In general, output data of an IFFT in parallel operation are output as illustrated in the rearranged data 31 in FIG. 3, and therefore the data rearrangement means 11 is not needed in a digital filter device in a nonlinear compensator. In other words, in the back propagation method as described in NPL 1, an output of an IFFT can be utilized as-is.

Next, operations of intermediate data calculation means 12, filter output first calculation means 13, and filter output second calculation means 14 will be described by use of specific mathematical expressions.

For example, assume that an impulse response h[n] of a digital filter device is expressed by equation 1.

$$h[n] = \begin{cases} 1 & (0 \leq n \leq 255) \\ 0 & \text{otherwise} \end{cases} \quad (1)$$

In this case, a filter output y[n] can be expressed by a difference equation such as equation 2 where an input signal is denoted as x[n]. Further, k in equation 2 is an integer.

$$y[n] = \sum_{k=0}^{255} x[n-k] \quad (2)$$

In an expansion related to y[n] and y[n−1] derived from equation 2, taking the difference between y[n] and y[n−1], and transposing y[n−1] from the left side to the right side yields a recurrence formula expressed by equation 3.

$$y[n]=y[n-1]+x[n]-x[n-256] \quad (3)$$

In equation 3, input signal values can be substituted for x[n] and x[n−256] as-is and a filter output already obtained can be substituted for y[n−1]. For example, calculate y[n] being a second output value by substituting a first output value for y[n−1]. For a next input of x[n], a next second output value can be obtained by substituting y[n], being the second output value already calculated, into equation 3 as y[n−1]. Therefore, by use of the recurrence formula in equation 3, a second output value can be calculated progressively for data input at a time other than a specific time by use of a first output value of data input at a specific time.

Expanding the difference equation in equation 2 and dividing the terms into sums of 32 terms yield an expression in equation 4. Since there are 32 pieces of data input at a time, the terms are divided into sums of 32 terms in equation 2.

$$\begin{aligned} y[n] &= (x[n] + x[n-1] + \ldots + x[n-31]) + \\ & \quad (x[n-32] + x[n-33] + \ldots + x[n-63]) + \ldots + \\ & \quad (x[n-224] + x[n-225] + \ldots + x[n-255]) \\ &= \sum_{k=0}^{31} x[n-k] + \sum_{k=0}^{31} x[n-32-k] + \ldots + \\ & \quad \sum_{k=0}^{31} x[n-224-k] \end{aligned} \quad (4)$$

An intermediate variable T[n] as intermediate data is defined by equation 5.

$$\begin{aligned} T[n] &= x[n] + x[n-1] + \ldots + x[n-31] \\ &= \sum_{k=0}^{31} x[n-k] \end{aligned} \quad (5)$$

y[n] can be expressed by equation 6 by use of the intermediate variable T[n].

$$\begin{aligned} y[n] &= T[n] + T[n-32] + T[n-64] + \ldots + T[n-224] \\ &= \sum_{k=0}^{7} T[n-32k] \end{aligned} \quad (6)$$

For example, an output value at n−32 can be denoted as y[n−32] and an output value at n−64 can be denoted as y[n−64].

Figure 4:
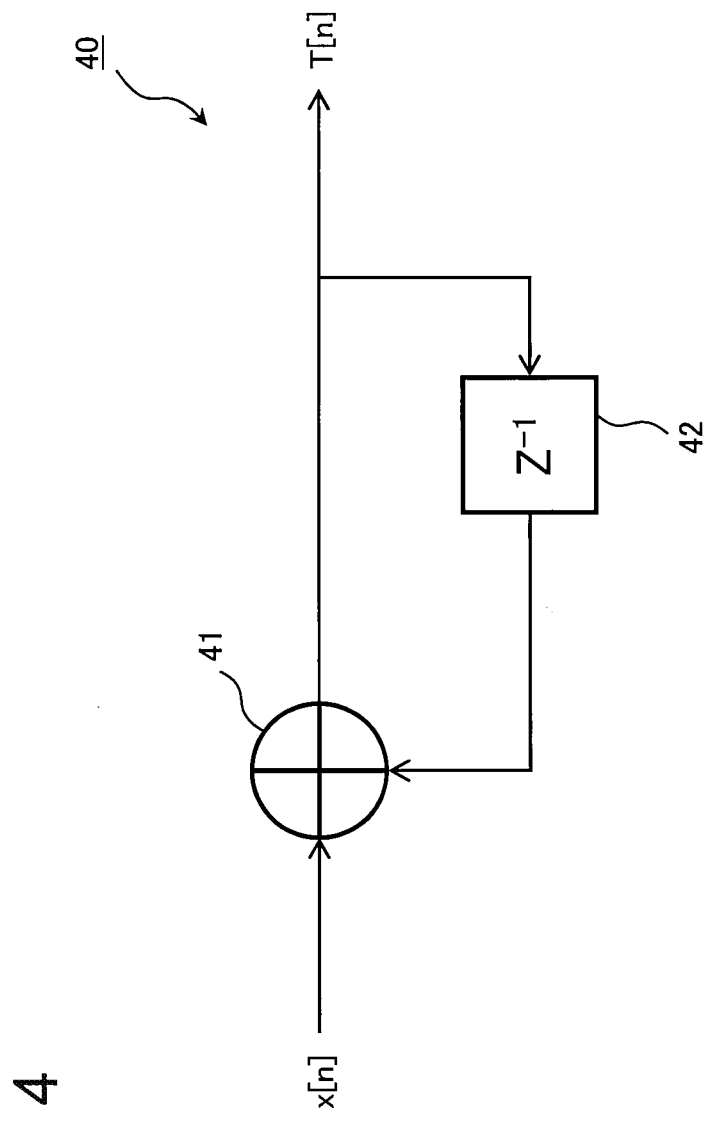
FIG. 4 is a configuration example of a circuit realizing intermediate data calculation means according to the first exemplary embodiment of the present invention.

In the present exemplary embodiment, the intermediate data calculation means 12 calculates an intermediate variable T[n] expressed by equation 5. The intermediate data calculation means 12 can be implemented with, for example, a circuit 40 with a configuration including an adder 41 and a delay device 42 as illustrated in FIG. 4.

Figure 5:
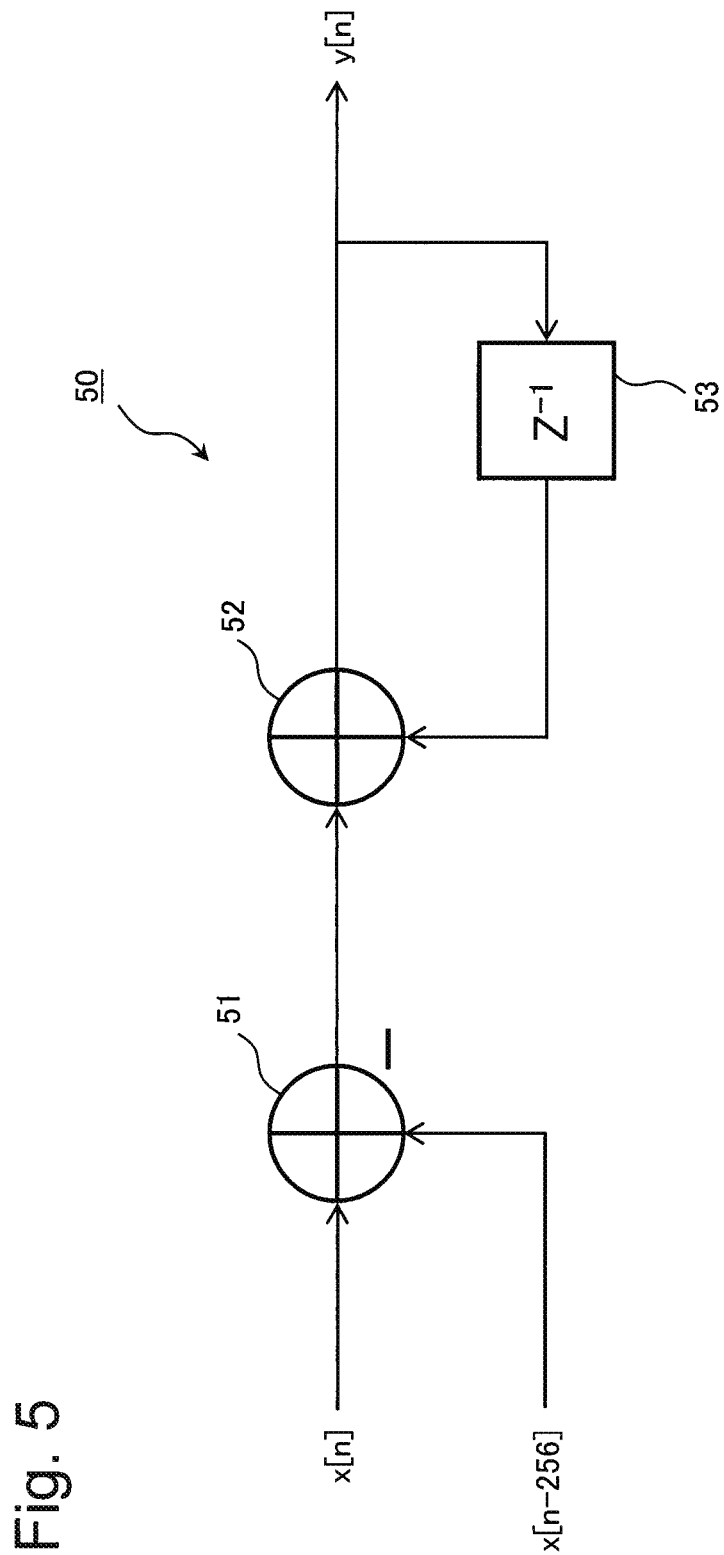
FIG. 5 is a configuration example of a circuit realizing filter output second calculation means according to the first exemplary embodiment of the present invention.

The filter output first calculation means 13 calculates a filter output value at a specific time (first output value) y[n], y[n−32], . . . , from an intermediate variable T[n] by use of equation 6. Further, the filter output second calculation means 14 can be implemented with a circuit 50 including a subtracter 51, an adder 52, and a delay device 53 as illustrated in FIG. 5.

Then, the filter output second calculation means 14 inputs output data of the filter output first calculation means 13 and the delay means 15 (first output value and rearranged data). The filter output second calculation means 14 applies the recurrence formula in equation 3 to the input output data of the filter output first calculation means 13 and the delay means 15, and calculates a filter output value at a time other than a specific time (second output value) y[n] included in the impulse response range. In other words, the filter output second calculation means 14 calculates y[n−1], y[n−2], . . . , y[n−31], y[n−33], . . . .

In order to apply the aforementioned description with actual numerical values to rearranged data including an L columns×M rows frame (L and M are natural numbers), following mathematical expressions (equations 7 to 11) can be used. N in the following mathematical expressions is a natural number.

Equation 7 is an equation expressing an impulse response and corresponds to equation 1.

$$h[n] = \begin{cases} 1 & (0 \le n \le N-1) \\ 0 & \text{otherwise} \end{cases} \quad (7)$$

Equation 8 is a difference equation and corresponds to equation 2.

$$y[n] = \sum_{k=0}^{N-1} x[n-k] \quad (8)$$

Equation 9 is an equation for calculating intermediate data and corresponds to equation 5.

$$T[n] = \sum_{k=0}^{L-1} x[n-k] \quad (9)$$

Equation 10 is an equation for calculating an output value at a specific time (first output value) and corresponds to equation 6.

$$y[n] = \sum_{k=0}^{N/L-1} T[n-Lk] \quad (10)$$

Equation 11 is a recurrence formula for calculating an output value at a time other than a specific time (second output value) and corresponds to equation 3.

$$y[n]=y[n-1]+x[n]-x[n-N] \quad (11)$$

By use of the aforementioned mathematical expressions (equations 7 to 11), a filter output value can be calculated from rearranged data including an L columns×M rows frame.

Next, an effect of the digital filter device according to the first exemplary embodiment will be described.

In general, straightforward implementation of calculation expressed by equation 2 with respect to input data 21 with 128 parallel data input requires 32640 (=255×128) adders.

On the other hand, the digital filter device according to the first exemplary embodiment of the present invention requires 128 (=1×128) adders for T[n] calculation by the intermediate data calculation means 12. Further, the filter output first calculation means 13 requires 896 (=7×128) adders and the filter output second calculation means 14 requires 256 (=2×128) adders. In other words, the digital filter device according to the first exemplary embodiment of the present invention can be configured with a total of 1280 (=10×128) adders and then a circuit scale can be reduced to approximately ¹⁄₂₅ of a circuit with a general configuration.

As described above, in the digital filter device according to the first exemplary embodiment of the present invention, a circuit scale can be reduced compared with a general digital filter device. A first reason is that, when a discrete filter output value at a specific time is calculated, the calculation result is obtained by commonalization of a required operation. A second reason is that a filter output value at a time other than a specific time is obtained by a recurrence formula by use of a discrete filter output value obtained in a previous cycle.

Further, among distortion types generated on a communication channel, the digital filter device according to the first exemplary embodiment of the present invention is able to compensate for nonlinear distortion not previously compensable by an LSI.

Further, in conventional optical communication, there is a problem that necessity for decrease of optical intensity to be within a range in which communication is less affected by nonlinear distortion causes increase in the number of repeaters and consequently increase in installation cost. The digital filter device according to the first exemplary embodiment of the present invention solves the problem of increase in installation cost described above and realizes nonlinear compensation without impairing performance of a digital filter device.

The present invention is not limited to a configuration of a digital filter device in nonlinear compensation or a filter device in nonlinear compensation, but is applicable to a general digital filter device and, furthermore, a signal processing device including a digital filter device.

Second Exemplary Embodiment

Next, a digital filter device according to a second exemplary embodiment of the present invention will be described. A configuration of the digital filter device according to the second exemplary embodiment is the same as the digital filter device according to the first exemplary embodiment illustrated in FIG. 1. In the second exemplary embodiment, in an example of inputting a data group in which one frame is composed of L columns×M rows of data, description is also made with assignment of actual numerical values such as the number of columns L being 32 and the number of rows M being 128.

The second exemplary embodiment is an example when an impulse response h[n] of a digital filter device can be expressed by equation 12. In equation 12, a is a real number greater than 0 and less than 1 (a: real number: 0<a<1).

$$h[n] = \begin{cases} a^n & (0 \le n \le 225) \\ 0 & \text{otherwise} \end{cases} \quad (12)$$

In the second exemplary embodiment, operations of data rearrangement means 11 and delay means 15 are the same as the first exemplary embodiment.

Operations of intermediate data calculation means 12, filter output first calculation means 13, and filter output second calculation means 14 of the digital filter device according to the second exemplary embodiment will be described by use of specific mathematical expressions similar to the first exemplary embodiment.

In this case, a filter output y[n] can be expressed by a difference equation such as equation 13, where an input signal is denoted as x[n].

$$y[n] = \sum_{k=0}^{255} a^k x[n-k] \quad (13)$$

In an expansion related to y[n] and y[n−1] derived from equation 13, taking the difference between y[n] and a×y[n−1], and transposing a×y[n−1] from the left side to the right side yield a recurrence formula expressed by equation 14.

$$y[n]=ay[n-1]+x[n]-a^{256}x[n-256] \quad (14)$$

In equation 13, dividing the terms into sums of 32 terms yields an expression in equation 15.

$$y[n] = (x[n] + ax[n-1] + \ldots + a^{31}x[n-31]) + \\ a^{32}(x[n-32] + ax[n-33] + \ldots + a^{31}x[n-63]) + \ldots + \\ a^{224}(x[n-224] + ax[n-225] + \ldots + a^{31}x[n-255]) \\ = \sum_{k=0}^{31} a^k x[n-k] + a^{32}\sum_{k=0}^{31} a^k x[n-32-k] + \ldots + \\ a^{224}\sum_{k=0}^{31} a^k x[n-224-k] \quad (15)$$

Each term on the right side of equation 15 is defined as an intermediate variable T[n] being intermediate data and expressed by equation 16.

$$T[n] = x[n] + ax[n-1] + \ldots + a^{31}x[n-31] \quad (16)$$
$$= \sum_{k=0}^{31} a^k x[n-k]$$

y[n] can be expressed by equation 17 by use of the intermediate variable T[n].

$$y[n] = T[n] + a^{32}T[n-32] + a^{64}T[n-64] + \ldots + a^{224}T[n-224] \quad (17)$$
$$= \sum_{k=0}^{7} a^{32k} T[n-32k]$$

Figure 6:
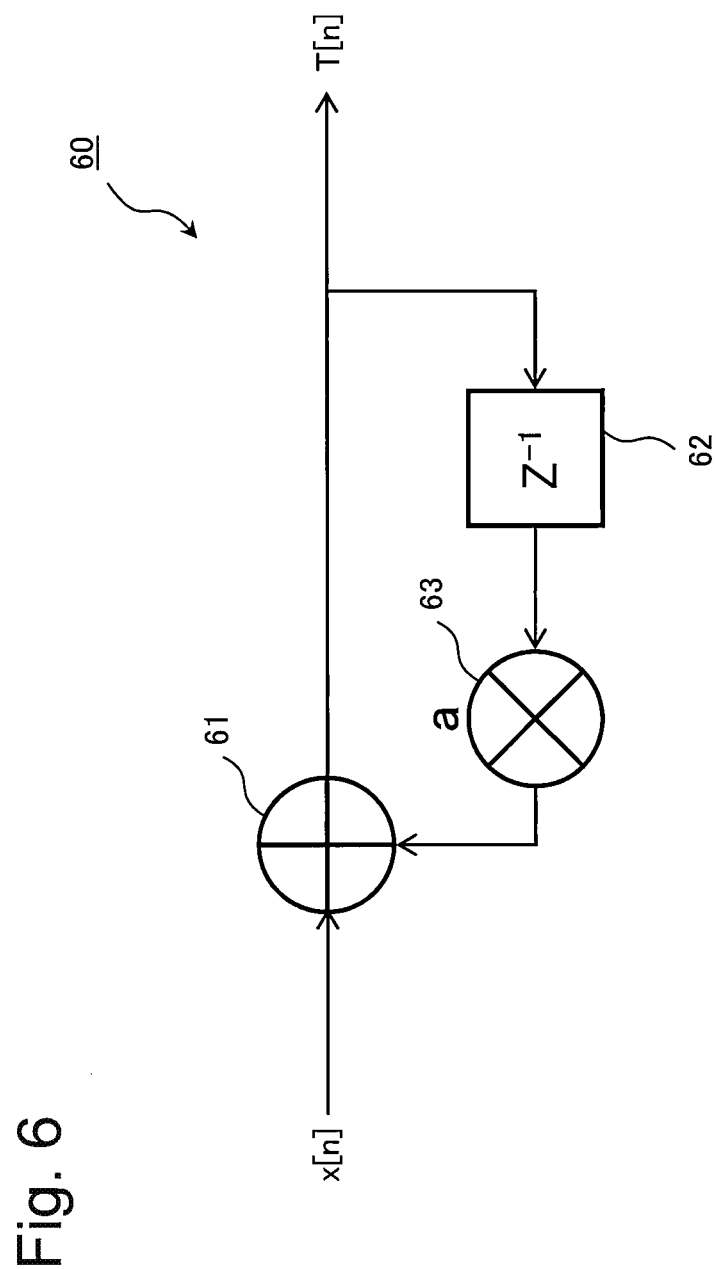
FIG. 6 is a configuration example of a circuit realizing intermediate data calculation means according to a second exemplary embodiment of the present invention.

In the second exemplary embodiment, the intermediate data calculation means 12 calculates the intermediate variable T[n] expressed by equation 16. The intermediate data calculation means 12 is implemented with a circuit 60 including an adder 61, a delay device 62, and a multiplier 63 as illustrated in FIG. 6.

Figure 7:
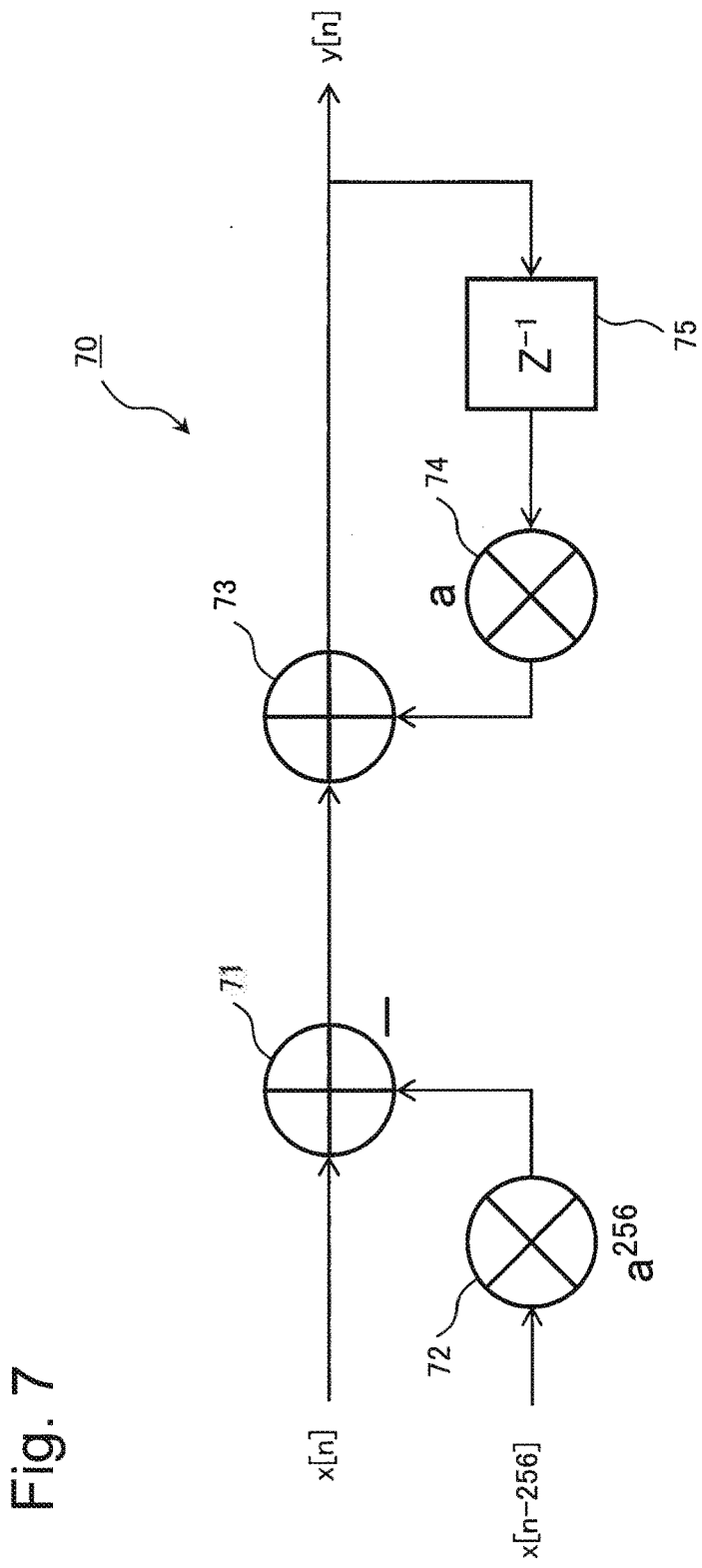
FIG. 7 is a configuration example of a circuit realizing filter output second calculation means according to the second exemplary embodiment of the present invention.

The filter output first calculation means 13 calculates a filter output value at a specific time (first output value) y[n], y[n−32], . . . , from the intermediate variable T[n] by use of equation 17. Further, the filter output second calculation means 14 is implemented with a circuit 70 including a subtracter 71, a multiplier 72, an adder 73, a multiplier 74, and a delay device 75 as illustrated in FIG. 7.

Then, the filter output second calculation means 14 inputs output data of the filter output first calculation means 13 and the delay means 15 (first output value and rearranged data). The filter output second calculation means 14 applies the recurrence formula in equation 14 to the input output data of the filter output first calculation means 13 and the delay means 15, and calculates a filter output value at a time other than a specific time (second output value) y[n].

In order to apply the aforementioned description with actual numerical values to rearranged data including an L columns×M rows frame, following mathematical expressions (equations 18 to 22) can be used. N is a natural number.

Equation 18 is an equation expressing an impulse response and corresponds to equation 12.

$$h[n] = \begin{cases} a^n & (0 \le n \le N-1) \\ 0 & \text{otherwise} \end{cases} \quad (18)$$

Equation 19 is a difference equation and corresponds to equation 15.

$$y[n] = \sum_{k=0}^{N-1} a^k x[n-k] \quad (19)$$

Equation 20 is an equation for calculating intermediate data and corresponds to equation 16.

$$T[n] = \sum_{k=0}^{L-1} a^k x[n-k] \quad (20)$$

Equation 21 is an equation for calculating an output value at a specific time (first output value) and corresponds to equation 17.

$$y[n] = \sum_{k=0}^{N/L-1} a^{Lk} T[n-Lk] \quad (21)$$

Equation 22 is a recurrence formula for calculating an output value at a time other than a specific time (second output value) and corresponds to equation 14.

$$y[n]=ay[n-1]+x[n]-a^N x[n-N] \quad (22)$$

By use of the aforementioned mathematical expressions (equations 18 to 22), a filter output value can be calculated from rearranged data including an L columns×M rows frame.

Next, an effect of the digital filter device according to the second exemplary embodiment will be described.

In general, an FIR digital filter device is configured with N multipliers, 2N−1 adders, and N−1 delay devices to implement the impulse response expressed by equation 7. In general, multipliers dominate a circuit scale of a digital filter device, and therefore, considering solely multipliers, straightforward implementation of 128-parallel 256 taps requires 32768 (=128×256) multipliers.

On the other hand, the digital filter device according to the second exemplary embodiment of the present invention requires 128 (=1×128) multipliers for T[n] calculation by the intermediate data calculation means 12. Further, the filter output first calculation means 13 requires 896 (=7×128) multipliers and the filter output second calculation means 14 requires 256 (=2×128) multipliers. In other words, the digital filter device according to the second exemplary embodiment of the present invention can be configured with a total of 1280 (=10×128) multipliers and then a circuit scale can be reduced to approximately 1/25 of a circuit with a general configuration.

While the digital filter device according to the second exemplary embodiment separately requires a memory for implementing the delay means 15, the number of memories for implementation of the delay means 15 generally does not exceed the amount of reduced multipliers.

As described above, in the digital filter device according to the second exemplary embodiment of the present invention, a circuit scale can be reduced compared with a general digital filter device similar to the digital filter device according to the first exemplary embodiment.

Further, while an impulse response is limited to equation 1 in the digital filter device according to the first exemplary embodiment, an impulse response expressed by equation 12 can also be calculated in the digital filter device according to the second exemplary embodiment.

Third Exemplary Embodiment

Next, a digital filter device according to a third exemplary embodiment of the present invention will be described. A configuration of the digital filter device according to the third exemplary embodiment is the same as the digital filter device according to the first exemplary embodiment illustrated in FIG. 1. In the third exemplary embodiment, in an example of inputting a data group in which one frame is composed of L columns×M rows of data, description is also made with assignment of actual numerical values such as the number of columns L being 32 and the number of rows M being 128.

The third exemplary embodiment is an example when an impulse response h[n] of a digital filter device can be expressed by equation 23. In equation 23, a is a real number greater than 0 and less than 1 (a: real number: 0<a<1).

$$h[n] = \begin{cases} a^{|n|} & (-255 \le n \le 255) \\ 0 & \text{otherwise} \end{cases} \quad (23)$$

The data rearrangement means 11 outputs rearranged data 91 illustrated in FIG. 9 in addition to the rearranged data 31 illustrated in FIG. 3. The rearranged data 91 are data having an input order reversed from the rearranged data 31.

In the third exemplary embodiment, an operation of delay means 15 is the same as the first exemplary embodiment and simply delays input data.

Operations of intermediate data calculation means 12, filter output first calculation means 13, and filter output second calculation means 14 of the digital filter device according to the third exemplary embodiment will be described.

In this case, a filter output y[n] can be expressed by a difference equation such as equation 24 where an input signal is denoted as x[n].

$$y[n] = \sum_{k=1}^{255} a^k x[n+k] + \sum_{k=0}^{255} a^k x[n-k] \quad (24)$$

The first and second terms on the right side of equation 24 are respectively denoted as A[n] and B[n].

In expansions related to A[n] and A[n−1] derived from the first term A[n] on the right side of equation 24, taking the difference between a×A[n] and A[n−1] yields a recurrence formula expressed by the upper row of equation 25. An equation on the lower row of equation 25 is an equation obtained by transposing A[n−1] from the left side to the right side in the recurrence formula on the upper row. In practice, the recurrence formula on the lower row of equation 25 is used.

$$aA[n]-A[n-1]=-ax[n]+a^{255}x[n+255]$$

$$A[n] \approx a^{-1}A[n-1]-x[n] \quad (25)$$

Similarly, in expansions related to B[n] and B[n−1] derived from the second term on the right side of equation 24, taking the difference between B[n] and a×B[n−1] yields a recurrence formula expressed by the upper row of equation 26. An equation on the lower row of equation 26 is an equation obtained by transposing a×B[n−1] from the left side to the right side in the recurrence formula on the upper row. In practice, the recurrence formula on the lower row of equation 26 is used.

$$B[n]-aB[n-1]=x[n]-a^{256}x[n-256]$$

$$B[n] \approx aB[n-1]+x[n] \quad (26)$$

Since a to the power of 255 in equation 25 is nearly 0, an approximate expression deleting the term of a to the power of 255 is used. Similarly, in equation 26, an approximate expression deleting the term of a to the power of 256 is expressed. Although the approximation is not necessarily required, without the approximation in equation 25, x[n+255] is required in calculation of y[n] and separate delay means is required because 255 is not a multiple of 32. Therefore approximation is preferably applied as in equations 25 and 26.

Similar to the first and second exemplary embodiments, dividing A[n] into groups of 32 terms yields an expression in equation 27.

$$A[n] + x[n] = (x[n] + ax[n+1] + \ldots + a^{31}x[n+31]) + \quad (27)$$
$$a^{32}(x[n+32] + ax[n+33] + \ldots + a^{31}x[n+63]) + \ldots +$$
$$a^{224}(x[n+224] + ax[n+225] + \ldots + a^{31}x[n+255]) =$$
$$\sum_{k=0}^{31} a^k x[n+k] + a^{32} \sum_{k=0}^{31} a^k x[n+32+k] + \ldots +$$
$$a^{224} \sum_{k=0}^{31} a^k x[n+224+k]$$

An intermediate variable S[n] as intermediate data is defined by equation 28.

$$S[n] = \sum_{k=0}^{31} a^k x[n+k] \quad (28)$$

A[n] can be expressed by equation 29 using the intermediate variable S[n].

$$A[n] = S[n] + a^{32}S[n+32] + a^{64}S[n+64] + \ldots + a^{224}S[n+224] = \quad (29)$$
$$\sum_{k=0}^{7} a^k S[n+32k]$$

Similar to A[n], dividing B[n] into groups of 32 terms yields an expression in equation 30.

$$B[n] = (x[n] + ax[n-1] + \ldots + a^{31}x[n-31]) + \quad (30)$$
$$a^{32}(x[n-32] + ax[n-33] + \ldots + a^{31}x[n-63]) + \ldots +$$
$$a^{224}(x[n-224] + ax[n-225] + \ldots + a^{31}x[n-255]) =$$
$$\sum_{k=0}^{31} a^k x[n-k] +$$
$$a^{32}\sum_{k=0}^{31} a^k x[n-32-k] + \ldots + a^{224}\sum_{k=0}^{31} a^k x[n-224-k]$$

An intermediate variable T[n] as intermediate data is defined by equation 31.

$$T[n] = x[n] + ax[n-1] + \ldots + a^{31}x[n-31] = \sum_{k=0}^{31} a^k x[n-k] \quad (31)$$

B[n] can be expressed by equation 32 by use of the intermediate variable T[n].

$$B[n] = T[n] + a^{32}T[n-32] + a^{64}T[n-64] + \ldots + a^{224}T[n-224] = \quad (32)$$
$$\sum_{k=0}^{7} a^{32k} T[n-32k]$$

Since y[n]=A[n]+B[n] is derived from equation 24, it can be seen that y[n], y[n−32], . . . , y[n−224] can be calculated by use of A[n], A[n−32], . . . , A[n−224], B[n], B[n−32], . . . , B[n−224], x[n].

In the third exemplary embodiment, the intermediate data calculation means 12 calculates the intermediate variables S[n] and T[n] as expressed in equations 28 and 31. The intermediate data calculation means 12 can be implemented with two of circuits 60 in FIG. 6 and is able to calculate S[n] and T[n]. T[n] is calculated by use of the rearranged data 31 and S[n] is calculated by use of the rearranged data 91.

Further, the filter output first calculation means 13 is able to calculate a filter output value at a specific time (first output value) y[n], y[n−32], . . . , directly from the intermediate variables S[n] and T[n] by use of equations 29 and 32.

Figure 8:
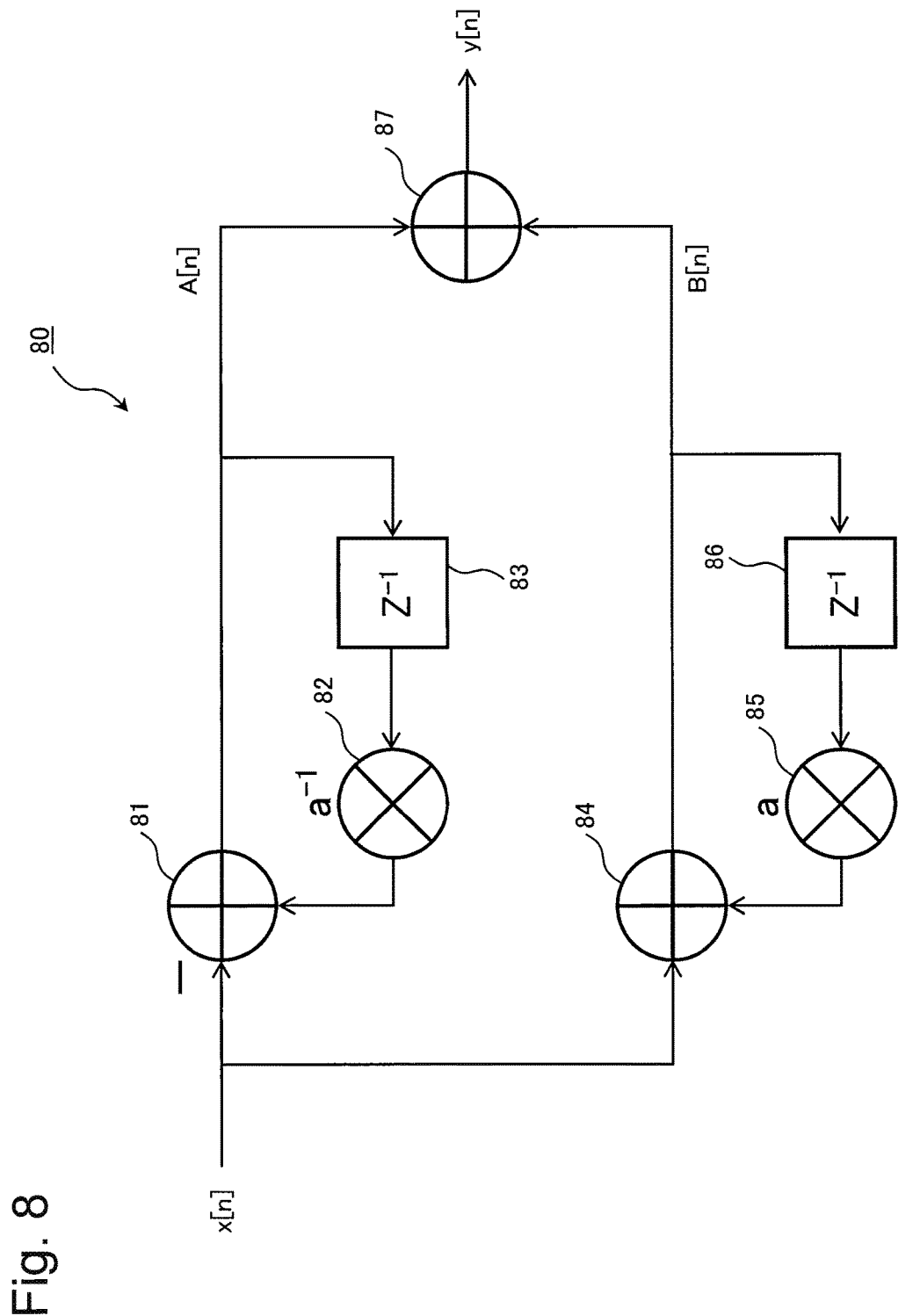
FIG. 8 is a configuration example of a circuit realizing filter output second calculation means according to a third exemplary embodiment of the present invention.

Furthermore, the filter output second calculation means 14 inputs output data of the filter output first calculation means 13 and the delay means 15 (first output value and rearranged data), and calculates a filter output value at a time other than a specific time (second output value) y[n] by use of equations 25 and 26. The filter output second calculation means 14 is implemented with a circuit 80 including a subtracter 81, a multiplier 82, a delay device 83, an adder 84, a multiplier 85, a delay device 86, and an adder 87 as illustrated in FIG. 8.

In order to apply the aforementioned description with actual numerical values to rearranged data including an L columns×M rows frame, following mathematical expressions (equations 33 to 43) can be used. N is a natural number.

Equation 33 is an equation expressing an impulse response and corresponds to equation 23.

$$h[n] = \begin{cases} a^{|n|} & (-(N-1) \le n \le N-1) \\ 0 & \text{otherwise} \end{cases} \quad (33)$$

Equation 34 is a difference equation and corresponds to equation 24.

$$y[n] = \sum_{k=1}^{N-1} a^k x[n+k] + \sum_{k=0}^{N-1} a^k x[n-k] \quad (34)$$

Let the first term on the right side of equation 34 be A[n] as expressed by equation 35, and let the second term be B[n] as expressed by equation 36.

$$A[n] = \sum_{k=1}^{N-1} a^k x[n+k] \quad (35)$$

$$B[n] = \sum_{k=0}^{N-1} a^k x[n-k] \quad (36)$$

Equations 37 and 38 are equations for calculating first intermediate data S[n] and second intermediate data T[n], and correspond to equations 28 and 31, respectively.

$$S[n] = \sum_{k=0}^{L-1} a^k x[n+k] \quad (37)$$

$$T[n] = \sum_{k=0}^{L-1} a^k x[n-k] \quad (38)$$

Equations 39 and 40 are equations for calculating A[n] and B[n], and correspond to equations 29 and 32, respectively.

$$A[n] = \sum_{k=0}^{N/L-1} a^k S[n+Lk] \quad (39)$$

$$B[n] = \sum_{k=0}^{N/L-1} a^{Lk} T[n-Lk] \quad (40)$$

Equation 41 is an equation for calculating an output value at a specific time (first output value).

$$y[n]=A[n]+B[n] \quad (41)$$

Equations 42 and 43 are recurrence formulae for calculating an output value at a time other than a specific time (second output value) and are the same as the equations on the lower row of equations 25 and 26, respectively.

$$A[n] \approx a^{-1}A[n-1]-x[n] \quad (42)$$

$$B[n] \approx aB[n-1]+x[n] \quad (43)$$

By use of the aforementioned mathematical expressions (equations 33 to 43), a filter output value can be calculated from rearranged data including an L columns×M rows frame.

Next, an effect of the digital filter device according to the third exemplary embodiment will be described.

In general, an FIR digital filter device is configured with N/2 multipliers, 2N−1 adders, and N−1 delay devices to implement the impulse response expressed by equation 13. When N is an odd number, the number of multipliers is N/2+0.5. In this case, multipliers dominate a circuit scale of a digital filter device and, therefore straightforward implementation of 128-parallel 513 taps requires 32768 (=128× 256) multipliers.

On the other hand, in the digital filter device according to the third exemplary embodiment of the present invention, the intermediate data calculation means 12 (calculation of S[n] and T[n]) requires 256 (=2×128) multipliers. Further, the filter output first calculation means 13 requires 1792 (=2×7×128) multipliers and the filter output second calculation means 14 requires 256 (=2×128) multipliers. In other words, the digital filter device according to the third exemplary embodiment of the present invention can be configured with a total of 2304 (=18×128) multipliers and then a circuit scale can be reduced to approximately 1/14 of a circuit with a general configuration.

While the digital filter device according to the third exemplary embodiment requires two memories for implementing the delay means 15, the number of memories for implementation of the delay means 15 generally does not exceed the amount of reduced multipliers.

The length of an impulse response is given as 256 and the length of a frame is given as 4096 in the first to third exemplary embodiments of the present invention as a result of consideration for ease of comprehension. Therefore, the length of an impulse response and the length of a frame may be changed as appropriate and do not limit the scope of the present invention to the aforementioned numerical values.

Fourth Exemplary Embodiment

Next, a digital filter device according to a fourth exemplary embodiment of the present invention will be described. A configuration of the digital filter device according to the fourth exemplary embodiment is the same as the digital filter device according to the third exemplary embodiment and operations other than filter output second calculation means and delay means are the same as the third exemplary embodiment.

Operations of the filter output second calculation means and the delay means of the digital filter device according to the fourth exemplary embodiment will be described. A filter output y[n] can be expressed by a difference equation such as equation 24 indicated in the third exemplary embodiment where an input signal is denoted as x[n].

In expansions related to A[n] and A[n−1] derived from the first term A[n] on the right side of equation 24 indicated in the third exemplary embodiment, taking the difference between a×A[n] and A[n−1] yields a recurrence formula expressed by the upper row of equation 44. An equation on the lower row of equation 44 is an equation obtained by transposing A[n−1] from the left side to the right side in the recurrence formula on the upper row. In practice, an approximated recurrence formula as expressed by the lower row of equation 44 is used.

$$aA[n]-A[n-1]=-ax[n]+a^{255}x[n+255]$$

$$A[n-1] \approx aA[n]+x[n] \quad (44)$$

When 1/a, being a number greater than 1, is used in a loop as illustrated in FIG. 8, as is the case with the recurrence formula on the lower row of equation 25 derived from the difference equation in equation 24 described in the third exemplary embodiment, a rounding error is always multiplied by 1/a and eventually diverges to infinity. Therefore A[n] is calculated by use of the recurrence formula on the lower row of equation 44 in order to improve calculation precision. In this case, a rounding error is always multiplied by a and therefore does not diverge to infinity.

Further, since a to the power of 255 in equation 44 is nearly 0, an approximate expression deleting the term of a to the power of 255 is used. Although the approximation is not necessarily required, without the approximation in equation 44, x[n+255] is required in calculation of y[n] and separate delay means is required because 255 is not a multiple of 32. Therefore approximation is preferably applied as in equations 44 and 26.

Furthermore, the filter output second calculation means 14 inputs output data of the filter output first calculation means 13 and the delay means 15, and calculates a filter output value at a time other than a specific time (second output value) y[n] by use of equations 44 and 26.

In equation 44, calculation of, for example, A[31] requires x[32] for calculation by A[31]=aA[32]+x[32]. Similarly, A[30] requires x[31] for calculation by A[30]=aA[31]+x[31], and A[29] requires x[30] for calculation by A[29]=aA[30]+x[30]. In other words, calculation of A[31], A[30], A[29], . . . requires data in reverse order (terms with larger numbers of n) such as x[32], x[31], x[30], . . . .

Consequently, the delay means 15 solves the problem by delaying the rearranged data 91 illustrated in FIG. 9 in addition to the rearranged data 31 illustrated in FIG. 3 before feeding the data to the filter output second calculation means 14.

Figure 10:
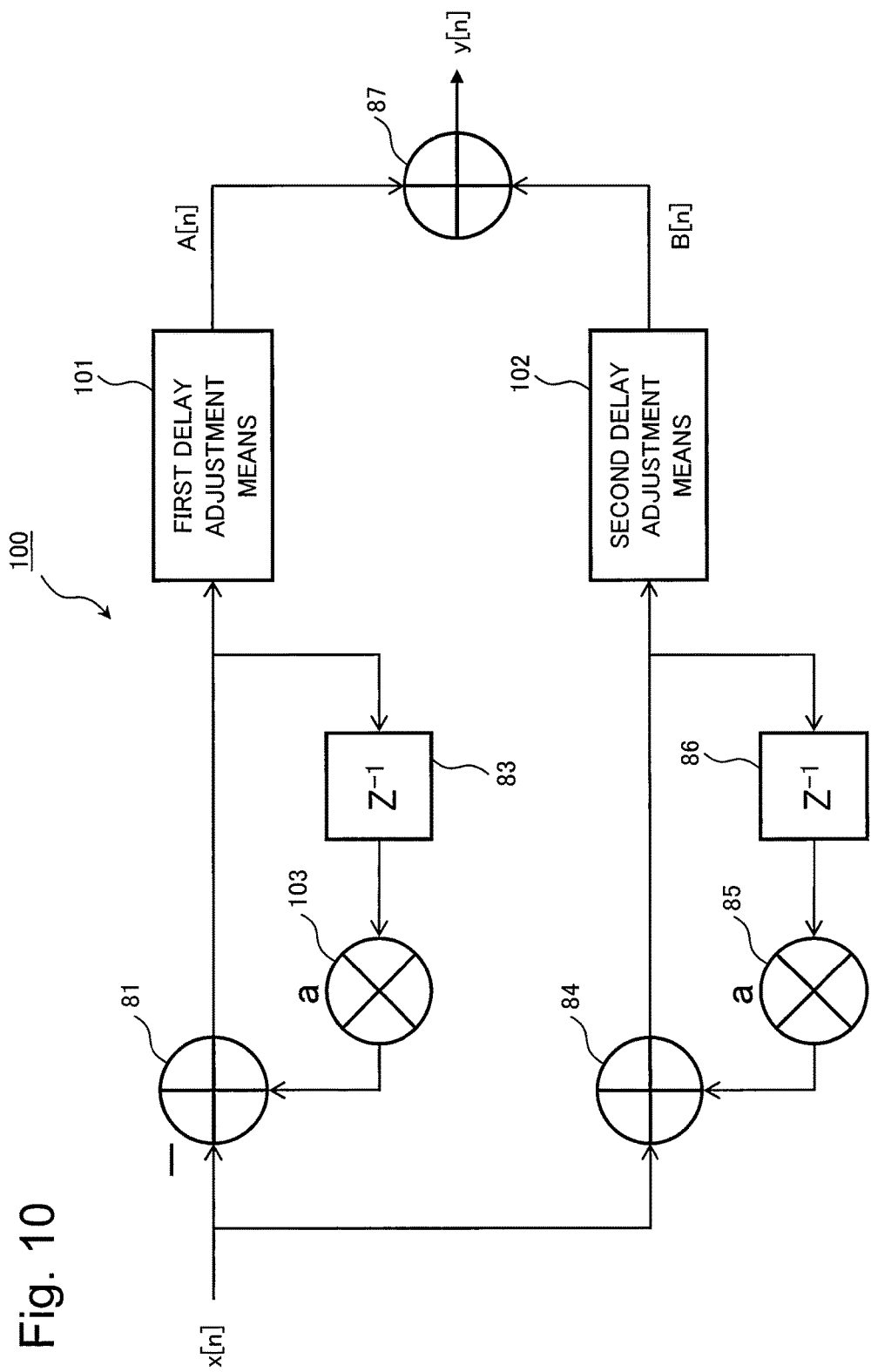
FIG. 10 is a configuration example of a circuit realizing filter output second calculation means according to a fourth exemplary embodiment of the present invention.
Figure 11:
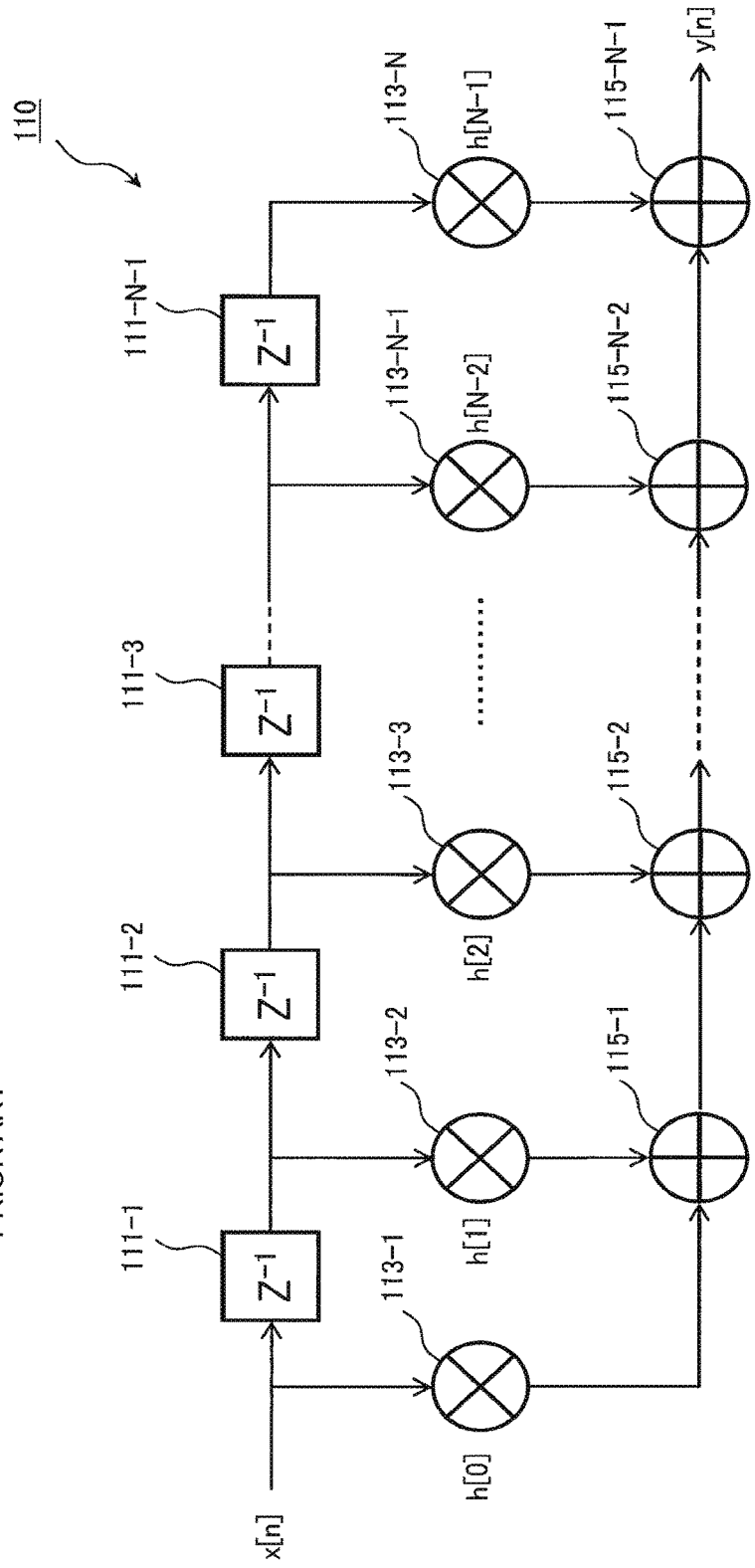
FIG. 11 is an example of a configuration diagram of a general FIR digital filter.
Figure 12:
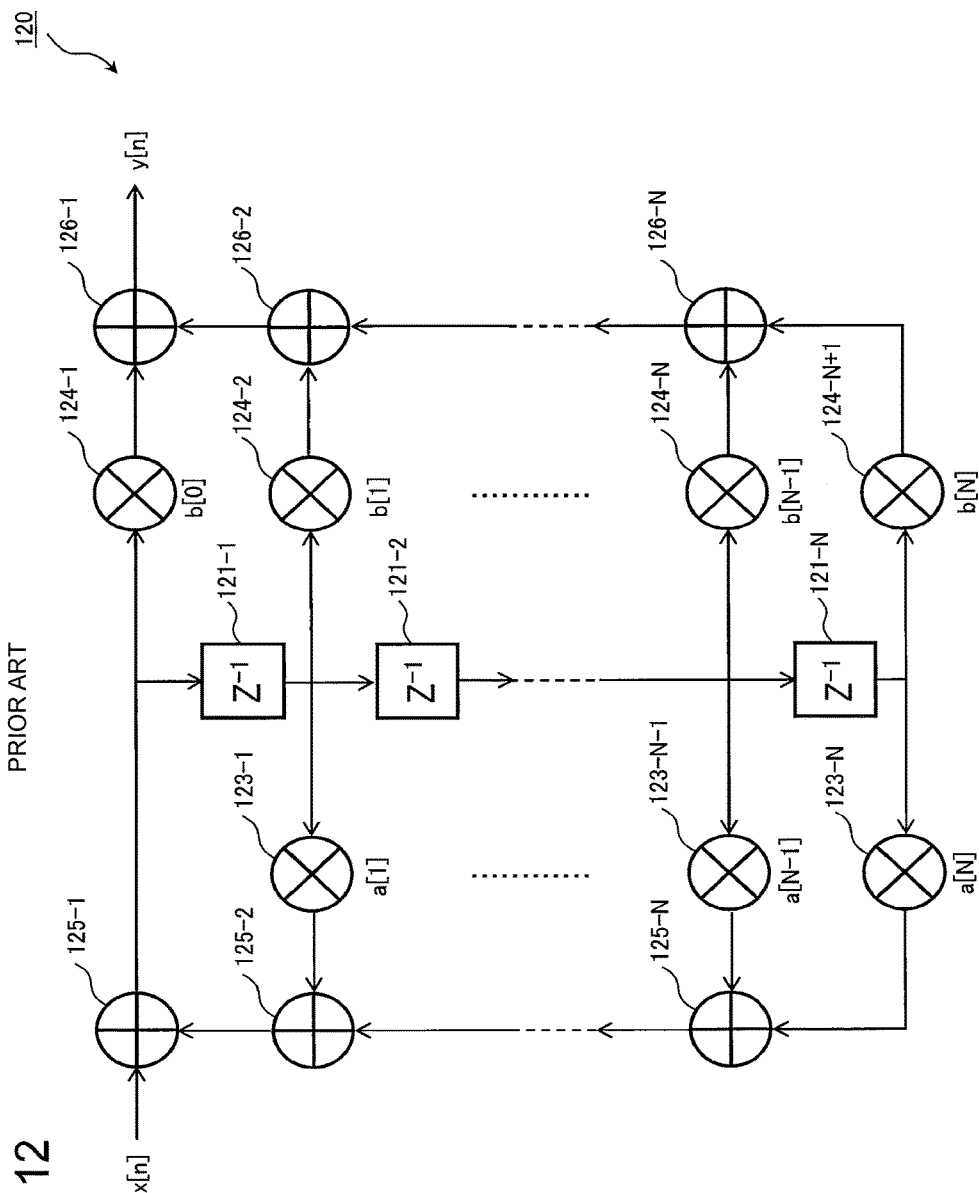
FIG. 12 is an example of a configuration diagram of a general IIR digital filter.
Figure 13:
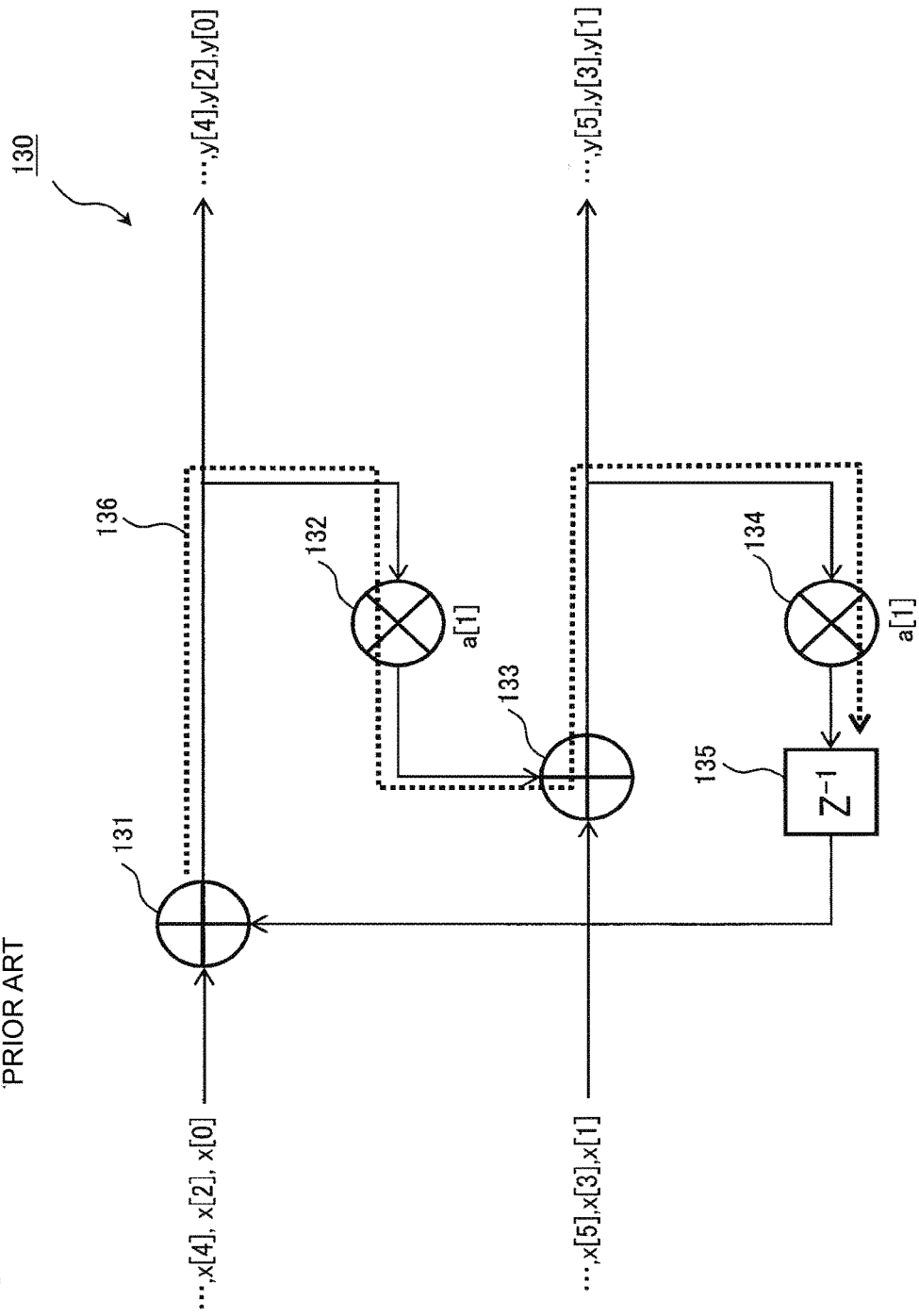
FIG. 13 is an example of a configuration diagram of a general IIR digital filter with a dual parallel configuration.

For example, since A[n] is calculated in reverse order, A[31] is calculated at a time 1 and A[30] at a time 2, and, on the other hand, B[31] is output at a time 31 and B[30] at a time 30, therefore a filter output value y[n] needs to be calculated with adjusted timing. Thus, the filter output second calculation means 14 is implemented with a circuit 100 including first delay adjustment means 101 and second delay adjustment means 102 that adjust timing (FIG. 10). The circuit 100 in FIG. 10 has the same configuration as the circuit 80 in FIG. 8 except that the multiplier 82 is replaced by a multiplier 103, and the first delay adjustment means 101 and the second delay adjustment means 102 are added.

In the fourth exemplary embodiment, a first output value and a second output value are calculated in a similar manner to the third exemplary embodiment except that equation 25 is replaced by equation 44. In other words, the fourth exemplary embodiment can be applied to rearranged data including an L columns×M rows frame by replacing 2.

equation 42 with the equation on the lower row of equation 44 in equations 33 to 43 described in the third exemplary embodiment. Timing of calculating A[n] and B[n] is adjusted by the first delay adjustment means 101 and the second delay adjustment means 102.

Next, an effect of the digital filter device according to the fourth exemplary embodiment will be described.

In the digital filter device according to the fourth exemplary embodiment, a circuit scale can be reduced to approximately 1/14 similar to the third exemplary embodiment. Furthermore, when a loop count is large, a filter output can be calculated more precisely than the third exemplary embodiment. While the first delay adjustment means 101, the second delay adjustment means 102, and the like are separately required, the scale of the required circuit does not generally exceed the amount of reduced multipliers.

The length of an impulse response is given as 256 and the length of a frame is given as 4096 in the first to fourth exemplary embodiments of the present invention as a result of consideration for ease of comprehension. Therefore, the length of an impulse response and the length of a frame may be changed as appropriate and do not limit the scope of the present invention to the aforementioned numerical values.

While the present invention has been described above with reference to the exemplary embodiments, the present invention is not limited to the aforementioned exemplary embodiments. Various changes and modifications that can be understood by those skilled in the art may be made to the configurations and details of the present invention, within the scope of the present invention.

The present application claims priority based on Japanese Patent Application No. 2013-116760 filed on Jun. 3, 2013, all of which disclosure is incorporated herein by reference.

INDUSTRIAL APPLICABILITY

The digital filter device according to the exemplary embodiments of the present invention is applicable to non-linear compensation in optical digital coherent communication. Further, a technology related to the digital filter device according to the exemplary embodiments of the present invention is applicable to any system using a digital filter device such as speech processing, image processing, and wireless communication.

REFERENCE SIGNS LIST

1 Digital filter device
11 Data rearrangement means
12 Intermediate data calculation means
13 Filter output first calculation means
14 Filter output second calculation means
15 Delay means
21 Input data
31, 91 Rearranged data
40, 50, 60, 70, 80, 100 Circuit
41, 52, 61, 73, 84, 87 Adder
42, 53, 62, 75, 83, 86 Delay
51, 71, 81 Subtracter
63, 72, 74, 82, 85, 103 Multiplier
101 First delay adjustment means
102 Second delay adjustment means
110 FIR filter
111 Delay group
113 Multiplier group
115 Adder group
120, 130 IIR filter
121 Delay group
123 First multiplier group
124 Second multiplier group
125 First adder group
126 Second adder group
131 Adder
132 Multiplier
135 Delay

What is claimed is:

1. A digital filter device comprising:
    a data rearrangement circuit implemented at least in hardware which executes rearrangement of input data and outputting rearranged data;
    an intermediate data calculation circuit implemented at least in hardware which processes the rearranged data input at a specific time and generating intermediate data;
    a filter output first calculation circuit implemented at least in hardware which calculates a first output value at the specific time by use of the intermediate data;
    a delay circuit implemented at least in hardware which delays the rearranged data by processing time taken in the intermediate data calculation circuit and the filter output first calculation circuit; and
    a filter output second calculation circuit implemented at least in hardware which inputs output values from the delay circuit and the filter output first calculation circuit, calculating a second output value at a time other than the specific time, and outputting a filter output value obtained by adding up the first and second output values.

2. The digital filter device according to claim 1, wherein the data rearrangement circuit
    inputs, from the input data composing a frame in which a plurality of data are arrayed in a grid format, the data in a same column at a same time, out of the data in different rows and
    executes rearrangement processing for interchanging a row and a column of the input data composing the frame without changing a number of rows and a number of columns of the input data.

3. The digital filter device according to claim 1, wherein the data rearrangement circuit
    inputs, from the input data composing a frame in which a plurality of data are arrayed in a grid format, the data in a same column at a same time, out of the data in different rows,
    changes a number of rows of the input data so as to match a number of rearrangement circuits included in the data rearrangement circuit, and
    executes rearrangement processing for interchanging a row and a column of the input data composing the frame.

4. The digital filter device according to claim 1, wherein the filter output first calculation circuit
    calculates the first output value by use of a difference equation with an input signal as a variable and
    the filter output second calculation circuit
    calculates the second output value by use of a recurrence formula derived from the difference equation.

5. The digital filter device according to claim 1, wherein the rearranged data is a matrix with L columns and M rows (L and M: natural numbers), an impulse response is expressed by an equation below:

$$h[n] = \begin{cases} 1 & (0 \leq n \leq N-1) \\ 0 & \text{otherwise} \end{cases}$$

where
n: data number,
h[n]: impulse response, and
N: natural number,
the intermediate data calculation circuit calculates the intermediate data by an equation below:

$$T[n] = \sum_{k=0}^{L-1} x[n-k]$$

where
k: integer,
T[n]: intermediate data at data number n, and
x[n]: input signal at data number n,
the filter output first calculation circuit calculates the first output value by an equation below:

$$y[n] = \sum_{k=0}^{N/L-1} T[n-Lk]$$

and
the filter output second calculation circuit calculates the second output value by an equation below:

$y[n]=y[1]+x[n]x[n-N]$.

6. The digital filter device according to claim 1, wherein the rearranged data is a matrix with L columns and M rows (L and M: natural numbers),
an impulse response is expressed by an equation below:

$$h[n] = \begin{cases} a^n & (0 \leq n \leq N-1) \\ 0 & \text{otherwise} \end{cases}$$

where
a: real number greater than 0 and less than 1,
n: data number,
h[n]: impulse response, and
N: natural number,
the intermediate data calculation circuit calculates the intermediate data by an equation below:

$$T[n] = \sum_{k=0}^{L-1} a^k x[n-k]$$

where
k: integer,
T[n]: intermediate data at data number n, and
x[n]: input signal at data number n,
the filter output first calculation circuit calculates the first output value by an equation below:

$$y[n] = \sum_{k=0}^{N/L-1} a^{Lk} T[n-Lk]$$

and
the filter output second calculation circuit calculates the second output value by an equation below:

$y[n]=ay[n-1]+x[n]-a^N \times [n-N]$.

7. The digital filter device according to claim 1, wherein the rearranged data is a matrix with L columns and M rows (L and M: natural numbers),
an impulse response is expressed by an equation below:

$$h[n] = \begin{cases} a^{|n|} & (-(N-1) \leq n \leq N-1) \\ 0 & \text{otherwise} \end{cases}$$

where
a: real number greater than 0 and less than 1,
n: data number,
h[n]: impulse response, and
N: natural number,
the intermediate data calculation circuit calculates the intermediate data by equations below:

$$S[n] = \sum_{k=0}^{L-1} a^k x[n+k]$$

and $$T[n] = \sum_{k=0}^{L-1} a^k x[n-k]$$

where
k: integer,
S[n]: first intermediate data at data number n,
T[n]: second intermediate data at data number n, and
x[n]: input signal at data number n, and
the filter output first calculation circuit calculates the first output value by an equation below:

$y[n]=A[n]+B[n]$ where $$A[n] = \sum_{k=0}^{N/L-1} a^k S[n+Lk]$$

and $$B[n] = \sum_{k=0}^{N/L-1} a^{Lk} T[n-Lk].$$

8. The digital filter device according to claim 7, wherein the filter output second calculation circuit
obtains the A[n] from a recurrence formula below:

$A[n] \approx a^{-1} A[n-1] - x[n]$ and obtains the B[n] from a recurrence formula below:

$B[n] \approx aB[n-1] + x[n]$.

9. The digital filter device according to claim 7, wherein the filter output second calculation circuit further comprises a first delay adjustment circuit which adjusts calculation timing of the A[n] and a second delay adjustment circuit which adjusts calculation timing of the B[n], obtains the A[n] by a recurrence formula below:

$$A[n-1] \approx aA[n]+x[n]$$

and obtains the B[n] by a recurrence formula below:

$$B[n]aB[n-1]+x[n].$$

10. A signal processing method executed by a digital filter device, the method comprising:

executing, by a data rearrangement circuit, rearrangement of input data and outputting rearranged data;

processing, by an intermediate data calculation circuit, the rearranged data input at a specific time and generating intermediate data;

calculating, by a filter output first calculation circuit, a first output value at the specific time by use of the intermediate data;

delaying, by a delay circuit, the rearranged data by processing time for calculation of the intermediate data and the first output value; and inputting the delayed rearranged data and the first output value to a filter output second calculation circuit, calculating, by the filter output second calculation circuit, a second output value at a time other than the specific time, and outputting a filter output value obtained by adding up the first and second output values.

* * * * *